United States Patent

Boinodiris et al.

[15] 3,697,980

[45] Oct. 10, 1972

[54] ISOLATED DIGITAL-TO-ANALOG CONVERTER

[72] Inventors: Stavros Boinodiris, Boca Raton; George A. Hellwarth, Deerfield Beach, both of Fla.

[73] Assignee: International Business Machines Corporation, Armonk, N.Y.

[22] Filed: June 30, 1971

[21] Appl. No.: 158,236

[52] U.S. Cl.............................................340/347 DA

[51] Int. Cl..............................................H03k 13/04

[58] Field of Search .................340/347 DA, 347 AD

[56] References Cited

UNITED STATES PATENTS

| | | | |
|---|---|---|---|
| 3,223,992 | 12/1965 | Bentley | 340/347 DA |
| 3,426,345 | 2/1969 | Kase | 340/347 DA |
| 3,588,880 | 6/1971 | Gross | 340/347 DA |
| 3,543,264 | 11/1970 | Carbrey | 340/347 DA |
| 3,449,741 | 6/1969 | Egerton | 340/347 DA |

*Primary Examiner*—Maynard R. Wilbur
*Assistant Examiner*—Jeremiah Glassman
*Attorney*—Thomas F. Galvin

[57] ABSTRACT

A digital-to-analog converter employing a pair of operational amplifiers connected in a balanced differential configuration to supply an analog output to a two-terminal load. The data and power inputs are isolated from the converter by isolation couplers. Each bit of binary data is sensed at the summing junction of each amplifier by means of a pair of balanced resistors which are switched in accordance with the binary signal. Each set of balanced resistors so sensed is in parallel with the other sets between the summing junctions. The balanced differential configuration enables either terminal at the two-terminal load to be at ground reference potential without deteriorating the common-mode rejection capability of the circuit, thereby eliminating the effect of voltages existing between the ground reference at the load and the ground reference at the binary and power input terminals of the converter.

10 Claims, 3 Drawing Figures

INVENTORS
STAVROS BOINODIRIS
GEORGE A. HELLWARTH

BY Thomas F. Galvin
AGENT

ISOLATED DIGITAL-TO-ANALOG CONVERTER

BACKGROUND OF THE INVENTION

1. Field of the Invention

This invention relates to the conversion of digital data to an analog voltage. More particularly, it relates to a digital-to-analog converter capable of yielding a highly precise analog output voltage where the reference potential at the load may be different from the reference potential of the digital data.

2. Description of the Prior Art

Designers of digital-to-analog converters attempt to have the reference potential of the output load equal to the reference potential of the input binary data and power. In practical systems, special grounding techniques must be used in establishing a single reference potential for the entire converter system. This is very difficult to achieve if the load impedance is located at a physically remote location from the digital-to-analog converter itself.

In lieu of providing equal reference potentials, the prior art has generally resorted to two techniques for providing differing load and source reference potentials without inducing undesired signals across the load. One of these techniques employs a very high output source impedance, i.e., an output current source in conjunction with a current-responsive load or a precision load impedance which develops the desired precision output voltage. However, this technique is often inconvenient due to restrictions placed on the load. In addition, the magnitude of the allowable reference potential differences is limited by the direct-coupled current output circuitry.

A second method which is more often used than the first for operating with different input and output reference potentials involves coupling the digital input data and the power supply across a fully isolated interface by means of radiated electromagnetic energy. For example, the use of iron-core transformers is quite common as a means of efficiently coupling energy across a non-conducting path for direct currents.

However, conventional transformer-coupled isolated digital-to-analog converters can exhibit considerably different performance characteristics, depending on which of the two output signal leads is connected to the load reference potential, which determines the polarity of the output load signal. Due to the inherently unbalanced configuration of these conventional circuits, the ability of the circuit to apply a voltage across the load which is independent of the reference potential is poor if the "normal" output terminal is referenced. On the other hand, the circuit may operate quite satisfactorily if the "common" or "ground" output terminal is at the reference level. For this reason, the commonly available digital-to-analog converters capable of highly precise outputs provide only one polarity of analog output signal.

SUMMARY OF THE INVENTION

It is therefore an object of this invention to improve the DC and AC isolation between the inputs and output of a digital-to-analog converter.

It is a further object of this invention to obtain precise analog outputs from a digital-to-analog converter across a two-terminal load wherein either terminal may be referenced to an external potential without affecting performance.

It is a further object of this invention to prevent AC signals generated internal to the converter from appearing across the output load impedance.

It is still another object of this invention to avoid errors introduced within a digital-to-analog converter when the reference potential at the output load is different from the reference potential at the input and power source of the converter.

These and other objects are accomplished in a digital-to-analog converter by employing a pair of balanced differential amplifiers connected in a differential configuration between the binary data input and a two-terminal load. In the preferred embodiment each data input terminal is sensed across the summing junctions of the operational amplifiers by means of a pair of balanced resistors which are coupled to the binary inputs by means of transistor switches operating in accordance with the level of the binary signal. In the preferred embodiment each set of resistors associated with each binary input terminal has values of resistance in a geometric progression with respect to the preceding set to ensure different analog output voltage levels for different input binary signals.

The use of the balanced operational amplifiers and the sets of balanced resistors connected in parallel between the summing junctions of the amplifiers results in a completely balanced and symmetrical circuit whereby the output load terminals may be interchanged, either one referenced to an external potential without change in performance. Undesired signals appearing differentially between the two output terminals, from either internally generated carrier-frequency signals or from externally generated common-mode signals, as for instance, from the load, are minimized by the balanced configuration in which a common potential is driven by the load reference potential.

It is feature of this invention to employ isolation transformers between the power source and the precision reference voltage driving the operational amplifiers and between the data input and the weighted ladder. This provides a high DC and AC isolation for low- and medium-frequency common-mode signals between the binary input and the analog output, low internal generation of common-mode potentials, and the ability to sustain high voltage potentials.

Another feature of this invention is the provision of a balun between the outputs of the operational amplifiers and the load terminals to provide a high isolation impedance at high frequency harmonics.

The invention, together with further objects and features, may best be understood by referring to the following description taken in conjunction with the drawings.

DESCRIPTION OF THE PREFERRED EMBODIMENT

Figure 1:
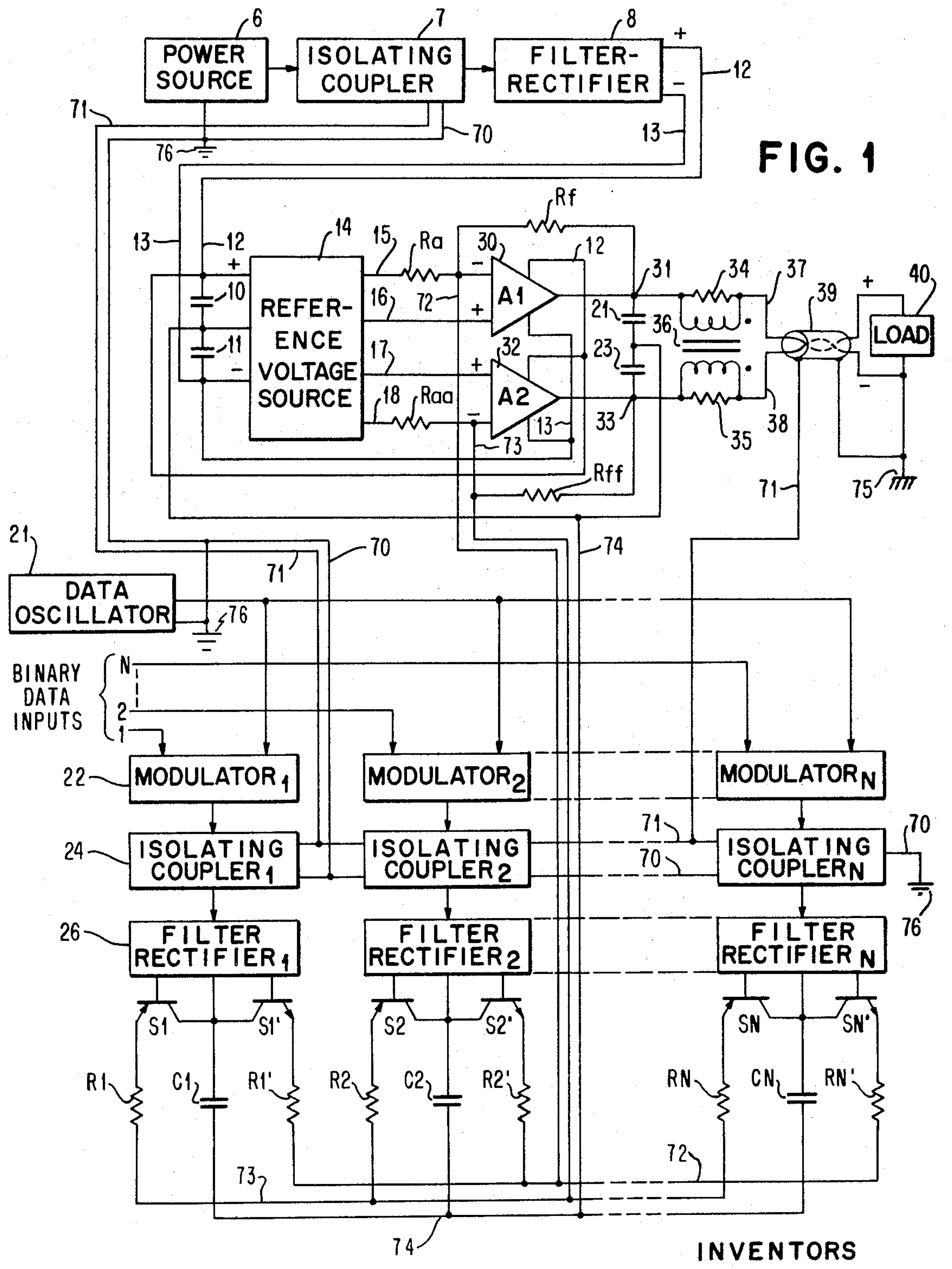
FIG. 1 is a schematic diagram of a preferred embodiment of the digital-to-analog converter of this invention.

Referring now to FIG. 1, a received binary input signal having N digits per group is received at binary input terminals, 1, 2, . . . N. In the preferred embodiment the data bits are received simultaneously at the input terminals, a "1" bit being represented by the lack of a pulse. Each terminal is connected to a modulator 22. In the drawing, terminal 1 is associated with modulator$_1$, terminal 2 is associated with modulator$_2$, etc. Each modulator is driven by a data oscillator 21 which provides a source of a clock pulse for each group of data signals. Modulator 22 is of conventional design and provides an output voltage pulse to isolating coupler 24 when a pulse from the data oscillator and the binary data input terminal coincide. The modulator design is well known to those of skill in the converter art and comprises typically a high speed logic AND gate for modulating the data with a pulse train from oscillator 21.

The output pulse from modulator 22 is fed across isolating coupler 24 and filter-rectifier 26 to provide DC current to the base terminals of complementary transistors S1 and S1′ which act as a balanced dual inverted-mode switch. The specific design of the isolation coupler 24 and filter-rectifier 26 will be more fully described hereafter. For the present it is only necessary to know that the pulses on the base terminals of S1 and S1′ are of opposite polarity so that both transistors are driven on or off simultaneously, depending on whether their associated input terminal has a "1" or "0" signal appearing thereon. Each data bit channel provides sufficient base current and base voltage to switch transistors S1 and S1′.

The emitters of inverter-transistor switches S1 and S1′ are connected to resistors R1 and R1′, respectively. The common terminals of the collectors of the switches are connected to bypass capacitor C1. In similar fashion, switches S2 and S2′ are connected to resistors R2, R2′ and capacitor C2, etc. In a typical converter of the present invention there are from eight to 10 binary inputs, depending on the application.

The complementary transistors are driven in the inverted-mode to achieve very low emitter-to-collector voltages in saturation. The switches are floating and form no DC current paths through any other part of the converter. All current flows through the balanced resistors and to the summing junctions (− terminals) of amplifiers 30 and 32. Hence, the balanced configuration of the oppositely conductive transistors effectively acts as a single-pole, single-throw switch between the resistors associated therewith; and for either conducting state of the transistors, the impedance driving the resistors is equal and balanced with respect to the amplifier reference potential on line 74. Thus the voltage across the bypass capacitors, C1 . . . CN, remains close to zero for either state of input data.

Resistors R1 and R1′ are preferably of equal value; however, they need not be precisely equal. Accurate operation is ensured if the sum of the resistances of R1 and R1′ is accurately established. In the preferred embodiment, the resistance sums of the resistors R1 + R1′, R2 + R2′. . . RN + RN′ are related by a geometric order according to the assigned weights of the corresponding input bits 1, 2, . . . N. For example, the relationship of resistance values may be selected to vary by a factor of 2 for binary coded input data. In mathematical terms: (1) $Ri + Ri' = 2^i Ro$, for $1 \leq i \leq N$ where $Ri + Ri'$ is the total resistance value of the $i$th data input and $Ro$ is a basic resistance value, e.g., 1.25 kilohms.

The output terminals of resistors R1, R2 . . . RN are connected via a common output line 73 to the negative input terminal of an operational amplifier 32. Similarly, the output terminals of resistors R1′, R2′. . . RN′ are connected at their output terminals via line 72 to the negative input terminal of operational amplifier 30. Hence, each set of balanced resistances, *Ri* and *Ri′*, is connected in parallel fashion with every other set between the summing junctions of amplifier 30 and 32 when their associated switches, Si and Si′, are operated.

The term "operational" amplifier, when used in connection with amplifiers 30 and 32 will be understood to mean a high-gain differential amplifier having a pair of inputs, a single output and two power supplies as the functional output ground.

A source of AC input power 6 passes through isolating coupler 7 and is rectified and filtered by filter-rectifier 8 to provide the input at lines 12 and 13 to both the amplifiers 30 and 32 and to a floating reference voltage source 14. Isolating coupler 7 is similar to isolating couplers 24 which are described more thoroughly with respect to FIG. 3. The reference voltage source 14 is preferably a precision source which provides different valued outputs for supplying voltages and currents to amplifiers 30 and 32. The specific configuration of a preferred voltage source 14 will be described hereafter with respect to FIG. 2. Power source 6 is preferably a power inverter and regulator of standard design which supplies a moderately regulated AC voltage. A typical power source provides a 30 volt output at 30 ma across filter-rectifier 8 with a 200 mv AC ripple.

The power supply is referenced for AC voltages to the amplifier reference potential 74 by capacitors 10 and 11 which shunt any residual power supply carrier frequency currents to the output points 31 and 33 through capacitors 21 and 23; but the currents are then blocked by balun 36 and are not conducted to the output leads 37 and 38. Reference voltage source 14 is a source of different, precise potentials at leads 15, 16, 17 and 18. These potentials are termed $V_{15}$, $V_{16}$, $V_{17}$ and $V_{18}$, respectively, the reference node being the center tap 74 between capacitors 10 and 11 which is the floating ground of the converter. Potential $V_{15}$ provides a current input to the summing point 72 at the inverting (−) terminal of amplifier 30 through input bias resistor Ra. Similarly, potential $V_{18}$ provides a current input to the summing point 73 at the inverting (−) terminal of amplifier 32 through input bias resistor Raa. Feedback resistors $R_f$ and $R_{ff}$ act to control the low frequency gain and response of amplifiers 30 and 32, respectively. In a typical embodiment $R_f = R_{ff}$ and Ra = Raa. Potentials $V_{16}$ and $V_{17}$ are applied to the non-inverting (+) terminals of amplifiers 30 and 32, respectively, as the basic differential reference voltage for the balanced resistor network.

The output voltage, $V_0$, from the balanced amplifier configuration is taken across output points 31 and 33 and is connected through a balun 36 to a two-conductor cable surrounded by shield 39. The cable connects to load 40 which is usually at a location remote from the converter. The load reference potential 75 may be considerably different from the reference potential 76 at the input to the converter, the difference between them being termed the common-mode voltage. The desired potential across the + and − leads of load 40 is termed the differential mode output voltage of the converter.

The combination of the output balun 36 and the two equal bypass capacitors 21 and 23, prevent the converter from coupling residual transformer leakage currents either from the power supply or data isolation couplers 24 to the load impedance 40. Resistors 34 and 35 are provided to damp the common-mode resonant circuit formed by the balun magnetizing inductance and the stray capacitance between floating ground 74 and circuit ground 76.

The balun 36 and capacitors 21 and 23 are effective high impedances at very high frequencies, including those above the bandwidth of the amplifiers 30 and 32. The balanced configuration of the amplifiers is also effective in preventing common-mode voltages from inducing differential-mode voltages across the load impedance 40 independent of which of the output leads 37 or 38 is referenced at 75.

Summarizing at this point, amplifiers 30 and 32 are thereby employed as differential amplifiers in a balanced, differential configuration, the resistors associated with one amplifier having resistance values approximately equal to the corresponding resistors of the other amplifier, e.g., Rf = Rff; Ra = Raa. Each switching stage operated by a binary input places its set of resistors, *Ri* and *Ri'* in series between the summing junctions of amplifiers 30 and 32; and each so-connected set of data input resistors is in parallel relationship with every other set connected between the amplifiers.

Figure 2:
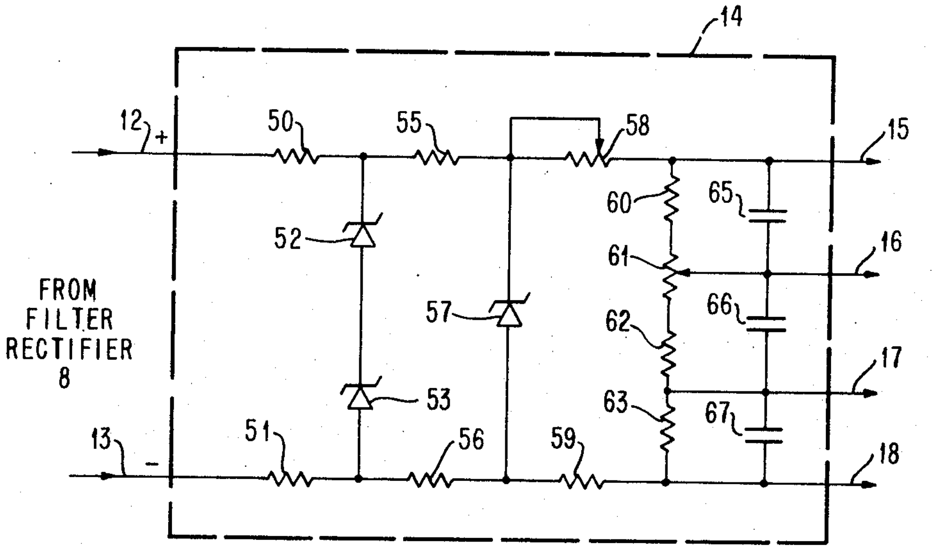
FIG. 2 is a detailed schematic diagram of a reference voltage source used to provide a precise voltage to the inputs of the operational amplifiers.

FIG. 2 is a schematic diagram of the reference voltage source 14 of FIG. 1 which provides a set of precision voltage outputs from leads 15, 16, 17 and 18 to the associated inputs of amplifiers 30 and 32. The voltage source 14 is generally known as a double-shunt zener regulator, the chief components of which are zener diodes 52 and 53, forming a first shunt across input leads 12 and 13, and diode 57 forming a second shunt. The diodes are reversed biased, as in conventional regulators of this type, by the DC voltage received from power source 6 through a conventionally designed filter-rectifier 8. The DC voltage received from filter-rectifier 8 on input terminals 12 and 13 is greater than the desired regulated voltage to be supplied across leads 15, 16, 17 and 18. The input voltage, as previously discussed, is already moderately regulated because of the design of power source 6; however, it may fluctuate. The load across the output terminals 15 through 18 must not vary. In operation, the DC voltage received from filter-rectifier 8, after being dropped across resistors 50 and 51 is initially regulated by diodes 52 and 53. This regulated voltage is then dropped across resistors 55 and 56 to the second shunt circuit comprising diode 57. Rheostat 58 is an adjustable element which supplies the final regulated voltage to resistors 60, 61 and 63 and serves as a voltage divider to accurately calibrate the maximum output voltage of the converter when the binary inputs are in their "on" state. Capacitors 65, 66 and 67 provide high frequency decoupling of noise by reducing the source impedance of the reference supply 14 at high frequencies. Potentiometer 61 serves as an adjustable device to accurately calibrate the minimum output voltage of the converter to zero when all binary inputs are "off". The calibration for the minimum output voltage is preferably performed prior to the calibration for the maximum output voltage.

Figure 3:
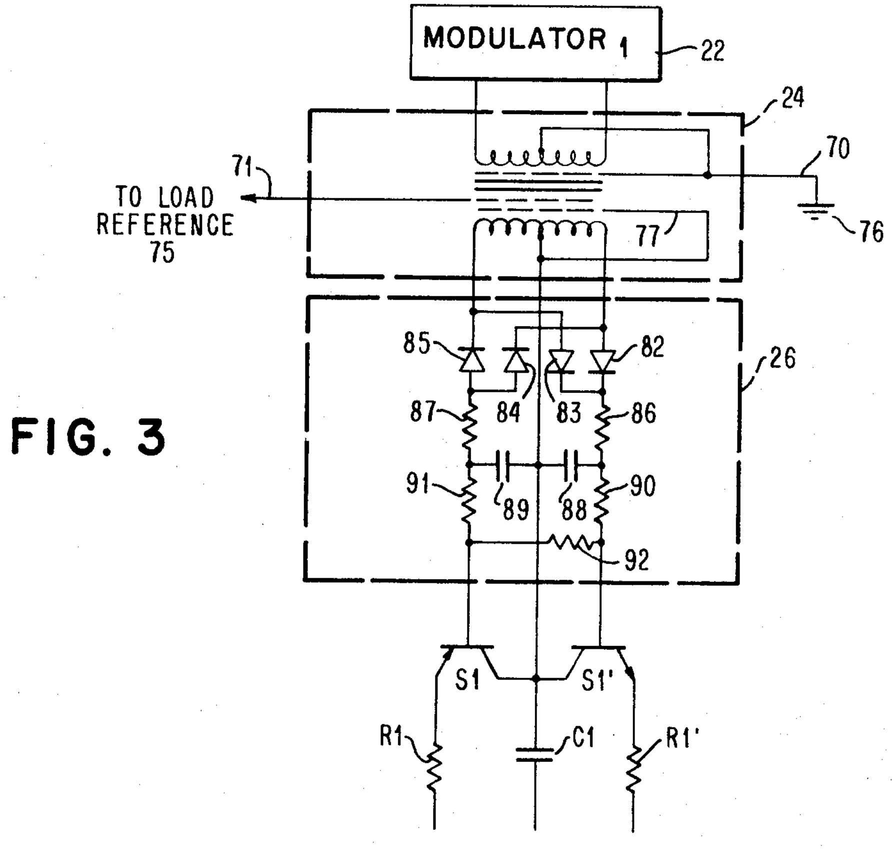
FIG. 3 is a detailed schematic diagram of an isolating coupler and a filter-rectifier circuit which couples the binary data and the power to the converter.

FIG. 3 is a detailed schematic of isolating coupler 24 and filter-rectifier 26 shown in block diagram form in FIG. 1. The isolating coupler is shown as a shielded, center-tapped, iron-core transformer which provides a high degree of isolation between the input data and the converter. As shown in the diagram the transformer primary is shielded by the converter potential 76, the secondary is shielded by the amplifier floating ground potential 74 through coupling capacitors C1, C2, . . . CN; and an intermediate third shield is connected by lead 71 to the output cable shield 39 (FIG. 1) which eventually is connected to load reference potential 75.

The AC voltage and current induced in the secondary of the transformer is rectified by the full-wave rectifier comprising diodes 82, 83, 84, 85 and filtered by an RC filter comprising series resistors 86, 87, 90 and 91, shunt resistor 92 and shunt capacitors 88 and 89 connected across the secondary of the transformer. Thus a square wave AC pulse at the output of modulator 22 induces an AC pulse in the secondary which is rectified to provide a positive voltage level at the base lead of NPN transistor switch S1' and a negative level at the base lead of PNP transistor switch S1, thereby causing both transistors to switch into a conductive state simultaneously. Because of their connection in the inverted mode, as shown, the transistors go heavily into saturation and offer practically no resistance between resistors R1' and R1.

Operation

Referring again to FIG. 1, the operation of the invention is as follows. The binary data inputs 1, 2 . . N are clocked by data oscillator 21 through modulators 22 and isolating couplers 24 to filter-rectifiers 26. Rectifiers 26 provide DC bias at the complementary switches S1, S1'. . . SN, SN'. As described with respect to FIG. 3, the isolating coupler 24 is preferably a center-tapped transformer and filter-rectifier 26 is a conventional full-wave AC rectifier and filter. The diode rectifiers 82 through 85 are polarized so that switch S1', an NPN transistor, will have a positive voltage level applied to its base. At the same time, switch S1, a PNP transistor, will have a negative voltage level applied to its base. Thus, both transistors are switched on simultaneously, establishing a conductive path between the resistors R1 and R1' and the balanced differential amplifier configuration.

This action will occur for every input stage where the binary data input is at a "1" level; at those terminals where the input remains at a "0" level, the corresponding switching stages will not operate, thereby blocking the associated balanced resistors *Ri* and *Ri'* from conducting current into the summing junctions. Thus, for example, if "1" bits are received at input terminals 1 and N, but not at terminal 2 or the remaining terminals, then resistor pairs R1 + R1' and RN + RN' will each be connected in parallel fashion across the inverting input terminals at nodes 72 and 73 and each will insert a current into the nodes of both amplifiers 30 and 32 equal to the ratio of the reference voltage $V_{16}$–$V_{17}$ to the resistor pair sums R1 + R1′ and RN + RN′. As already discussed, the balanced resistors R1 and R1′ and RN and RN′ of each switching stage form individual series connections between the inverting terminals of amplifiers 30 and 32.

The bypass capacitors C1, C2 . . . CN, associated with each switching stage prevent any residual high frequency current across the isolating couplers from flowing to the amplifiers. This current would appear as common-mode current between the balanced resistors, and the amplifiers might not reject it due to the high frequency of the current. The bypass capacitors C1, C2 . . . CN conduct the current through line 74 and the balanced bypass capacitors 21 and 23 at the output of the amplifiers where it is blocked by balun 36. In the preferred embodiment, the values of the bypass capacitors C1 . . . CN are inversely proportional to the values of the balanced resistors R1+R1′ . . . RN+RN′.

The floating reference voltage source 14 supplies reference potentials at 16 and 17 of approximately equal but opposite value to the reference junctions (non-inverting terminals) of amplifiers 30 and 32. In the quiescent state, i.e., when none of the switching stages is activated, a bias current path is also established between the positive side 15 of the output reference voltage 14 ($V_{15}$), through bias resistor Ra, through feedback resistor Rf to the output 31 of amplifier 30; also a bias current path is established in a balanced fashion from the negative side of reference voltage 14 ($V_{18}$), through bias resistor Raa, through feedback resistor Rff to output 33 of amplifier 32. The total current at the summing junctions of amplifiers 30 and 32 is, of course, ideally zero. The output voltage, $V_{31} - V_{33}$, across load 40 can be set equal to zero with no switches activated by proper selection of the resistances of resistors Ra, Raa, Rf and Rff and of the voltages $V_{15}$ through $V_{18}$ and by adjusting potentiometers 58 and 61; or the output voltage, $V_{31} - V_{33}$, can be set equal to any desired non-zero bias voltage, such as is done when either polarity of output voltage is desired by control of the input data bits.

Assume now that a binary "1" input is received at terminals 1 and N, and all other switches are off. The corresponding switching stages are activated and resistors R1 and RN are connected at the inverting input of amplifier 32. Similarly, resistors R1′ and RN′ are connected at the inverting terminal of amplifier 30. A pair of parallel connections is thereby provided between the inverting inputs of the amplifiers by means of resistors R1 and R1′ and RN and RN′. The potential across the load, $V_{31} - V_{33}$, is given approximately by the formula neglecting error terms where the summation is made only for those inputs $i$ in the "1" state.

$$(2) \qquad V_{31} - V_{33} = (V_{16} - V_{17}) \left(1 + \sum_{i=1}^{N} \frac{Rf + Rff}{Ri + Ri'}\right) - (V_{15} - V_{16}) \frac{Rf}{Ra} - (V_{17} - V_{18}) \frac{Rff}{Raa}$$

In summary, our invention has yielded a digital-to-analog converter which is highly isolated from noise generated external to or within the converter.

The dual amplifier configuration yields an analog output with a high common-mode rejection ratio (CMRR) at high as well as at DC and low frequencies. The principal sources of common-mode voltage are the several isolating couplers and the external ground reference 75; the effect of these voltages on the differential output voltage across the load is essentially eliminated by the present invention. Thus, either the positive or negative side of the load can be grounded to the external reference potential without affecting the differential load voltage.

Isolation from the power and data inputs is provided by means of isolating couplers 7 and 24. Shielded, iron-core transformers are preferred, being both more practical and less expensive than other types of isolation couplers which could be used.

However, the isolating couplers are only partially effective. For example, they are ineffective to prevent common-mode voltages from being transmitted into the converter from the external load and throughout the converter by stray capacitances and the capacitance of the various transformers. In a practical system, the load is at a location remote from the converter and its reference may be substantially different from the input data and power reference. Current produced at the load due to this difference forms a loop with the capacitances within the converter and may yield a significant common-mode voltage at the converter output.

In addition to the common-mode voltage generated by the external load, noise may be generated within the converter itself which is not eliminated by the isolating couplers. This noise is caused by the residual high frequency signals produced at the power source 6, data oscillator 21, and the data inputs. It also appears at the two output terminals as a common-mode signal.

The effect of these undesired signals not isolated from the converter output by the isolation couplers are virtually eliminated by the balanced differential amplifier configuration.

While the invention has been particularly shown and described with reference to a preferred embodiment thereof, it will be understood by those skilled in the art that the foregoing and other changes in form and detail may be made therein without departing from the spirit and scope of the invention.

We claim:

1. A highly isolated digital-to-analog converter for converting data received at a plurality of digital input terminals to an analog output signal comprising:

AC data isolation coupling means for coupling the digital input signals into the converter;

first and second differential amplifier means arranged in a balanced differential configuration each including an input summing junction, an input reference terminal and an output terminal, for generating an analog signal across said output terminals;

a plurality of switching stages, each stage coupled to an associated digital input terminal by said isolation coupling means, and including a balanced pair of transistor switching devices and a balanced pair of resistive elements, each said stage arranged to be coupled between the summing junctions of said first and second amplifier means in response to a digital signal at its associated input terminal;

an output load having a first terminal and a reference terminal;

high-frequency impedance means coupling the output terminals of said amplifiers with the first and reference terminals of the output load for preventing high frequency input leakage current from flowing through the load;

said balanced differential configuration preventing common-mode voltages from inducing differential voltages across the load, whereby either output terminal of said amplifiers may be connected to the reference terminal of the load without affecting the common-mode rejection response of the converter.

2. A digital-to-analog converter as in claim 1 wherein said high frequency impedance means is a balun and said AC isolation coupling means comprises an iron-core transformer having means for shielding said transformer from common-mode signals emanating from the converter reference or the output load reference.

3. A digital-to-analog converter as in claim 1 wherein the resistance of said balanced resistors in each said switching stage is in geometric progression with respect to the resistance of said balanced resistors in the preceding switching stage.

4. A digital-to-analog converter as in claim 1 wherein each said differential amplifier means comprises an operational amplifier having feedback means connected between the output terminal and the summing junction, said summing junctions and said balanced resistors coupled between the summing junctions being supplied by a source of bias current.

5. A digital-to-analog converter as in claim 4 wherein said source of bias current comprises:

a source of input power;

reference voltage means for providing said bias current; and

AC power isolation coupling means for coupling the source of input power to the reference voltage means.

6. A digital-to-analog converter as in claim 5 further comprising: capacitance means connected between said AC power isolation coupling means and the high frequency impedance means for bypassing around the differential amplifier means any high frequency currents generated across said AC power isolation coupling means.

7. A digital-to-analog converter as in claim 1 wherein said transistor devices are complementary conductivity types driven in the inverted mode between said resistive pair, thereby driving the balanced resistors with equal and balanced impedances.

8. A digital-to-analog converter as in claim 7 further comprising: capacitance means connected between the collectors of said transistors and the high frequency impedance means for bypassing around the differential amplifier means any high frequency currents generated across the AC data isolation coupling means.

9. A system for converting digital data into an analog voltage form comprising:

a plurality of digital input terminals;

switching means including first and second complementary conductivity type transistors driven in the inverted mode, one said switching means associated with each input terminal;

AC data isolation means including shielded transformers coupled to each input terminal for operating said switching means in accordance with signals on their associated input terminals;

first and second operational amplifiers arranged in a balanced differential configuration, each including an input summing junction, an input reference terminal and an output terminal, for generating an analog signal across said output terminals;

an output load having a first terminal and a reference terminal;

high-frequency impedance means including a balun coupling the output terminals of said amplifiers with the first and reference terminals of the output load for preventing high frequency input leakage current from flowing through the load;

a source of input AC power;

AC power isolation means including a shielded transformer for coupling the power source to the input of a reference voltage source, said reference source supplying bias potentials to the reference input terminals of said amplifiers and bias current to the summing junctions of said amplifiers;

a set of first and second balanced resistors associated with each digital input terminal and coupled between said first and second operational amplifiers, respectively, and the output of said first and second transistors, respectively, said first and second resistors connected in series relationship with each other between the summing junctions of said amplifiers when said transistors are operated and in parallel with the so-connected sets of resistors associated with other digital input terminals;

said balanced differential configuration preventing common-mode voltages from inducing differential voltages across the load, whereby either output terminal of said amplifiers may be connected to the reference terminal of the load without affecting the common-mode rejection response of the converter.

10. A system as in claim 9 wherein the total resistance of said balanced resistors associated with a digital input terminal is in geometric progression with respect to the total resistance of said balanced resistors associated with the preceding digital input terminal, and further comprising:

capacitance means connected between the collectors of said transistors and the balun for bypassing around the operational amplifiers any high frequency currents generated across the AC input transformers; and capacitance means connected between said AC power isolation transformer and the balun for bypassing around the operational amplifiers any high frequency currents generated across said AC power isolation transformers.

* * * * *